United States Patent [19]
Koyama et al.

[11] Patent Number: 5,177,569
[45] Date of Patent: Jan. 5, 1993

[54] SEMICONDUCTOR DEVICE HAVING A TWO LAYERED STRUCTURE GATE ELECTRODE

[75] Inventors: Tohru Koyama; Katsuhiko Tamura; Yasuna Nakamura; Yoshiko Kokawa; Kenji Kusakabe, all of Hyogo, Japan

[73] Assignee: Mitsubishi Denki Kabushiki Kaisha, Tokyo, Japan

[21] Appl. No.: 789,722

[22] Filed: Nov. 8, 1991

[30] Foreign Application Priority Data

Nov. 19, 1990 [JP] Japan .................. 2-314541

[51] Int. Cl.⁵ .......................... H01L 29/78
[52] U.S. Cl. ........................ 257/412; 257/368; 257/627; 257/754
[58] Field of Search ............. 357/23.1, 59 K, 60, 357/71; 437/193, 195

[56] References Cited

U.S. PATENT DOCUMENTS

| | | |
|---|---|---|
| 4,808,555 | 2/1989 | Mauntel et al. .......... 437/193 |
| 4,897,368 | 1/1990 | Kobushi et al. .......... 437/193 |

FOREIGN PATENT DOCUMENTS

| | | | |
|---|---|---|---|
| 64-49225 | 2/1989 | Japan ................. | 357/71 |
| 1-220438 | 9/1989 | Japan ................. | 437/193 |
| 2-140933 | 5/1990 | Japan ................. | 357/60 |

OTHER PUBLICATIONS

*MOS LSI Manufacturing Technology*, Nikkei McGraw-Hill, pp. 89-91, 1985.

*Primary Examiner*—Rolf Hille
*Assistant Examiner*—Steven Loke
*Attorney, Agent, or Firm*—Lowe, Price, LeBlanc & Becker

[57] ABSTRACT

A semiconductor device not aggravated in transistor characteristic even when an impurity region is formed by ion implantation using a gate electrode as a mask, and a method of manufacturing thereof are disclosed. The semiconductor device includes a gate electrode 10 implemented by a polycrystal silicon layer 4 having the crystal orientation of the crystal grains thereof arranged in a predetermined orientation, and a single crystal silicon layer 5 formed on the polycrystal silicon layer 4 having a crystal orientation identical to that of the polycrystal silicon layer 4. The channelling phenomenon in which B⁻ ions pass through to beneath the gate electrode 10 is prevented in forming an impurity region 6 by ion implantation to obtain a semiconductor device that does not have the characteristic of the formed transistor aggravated.

11 Claims, 11 Drawing Sheets

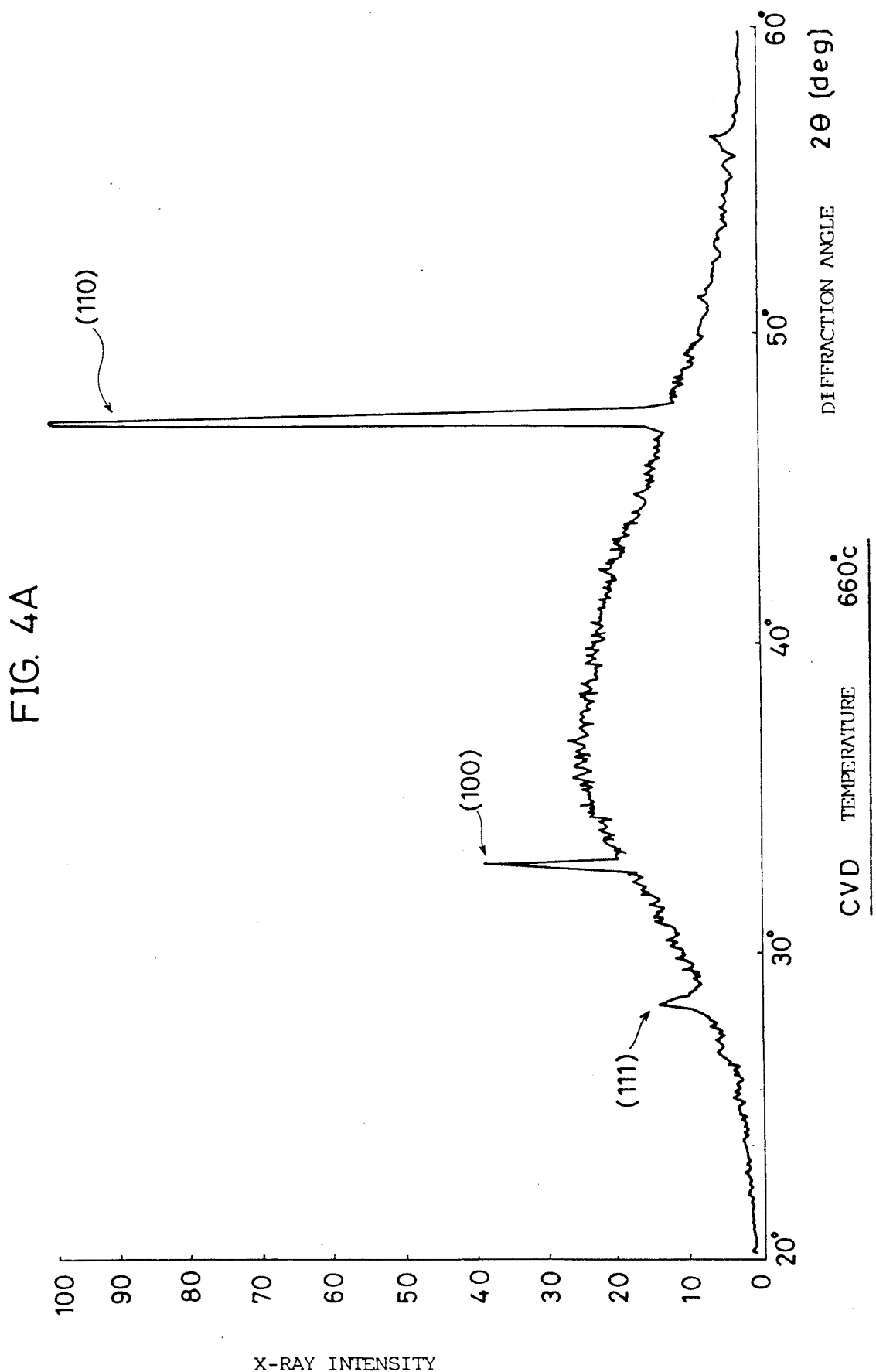

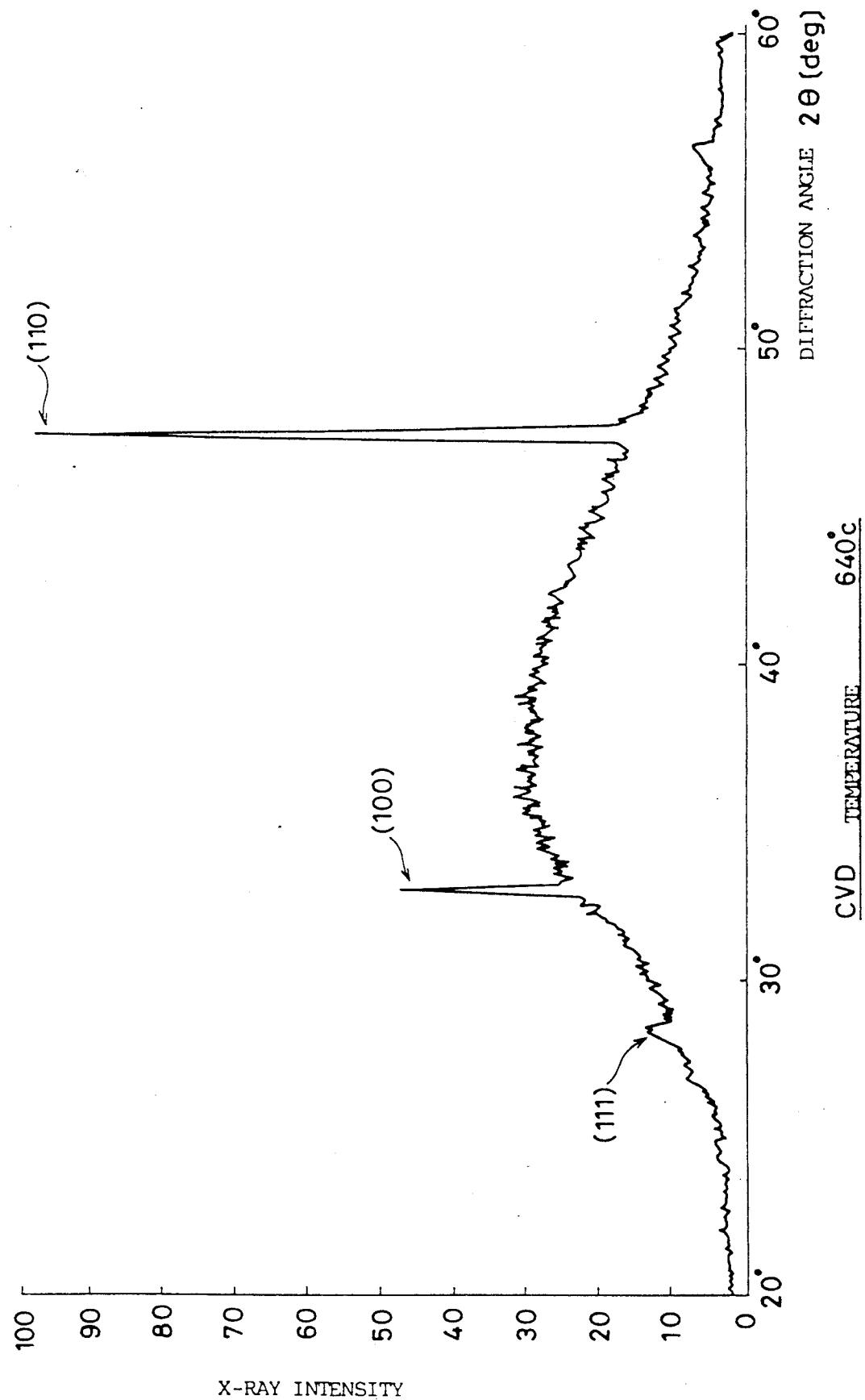

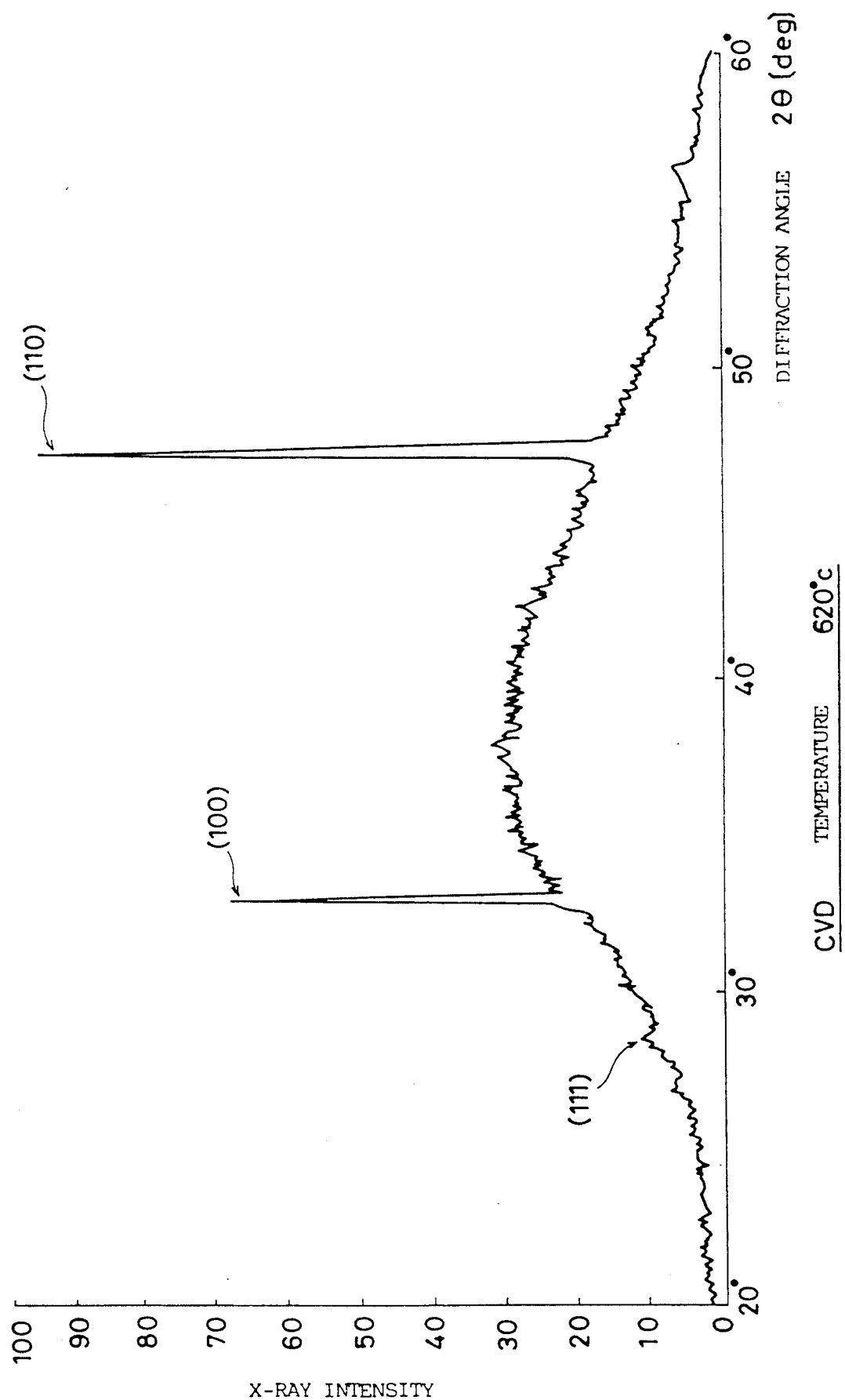

SEMICONDUCTOR DEVICE HAVING A TWO LAYERED STRUCTURE GATE ELECTRODE

BACKGROUND OF THE INVENTION

1. Field of the Invention

The present invention relates to semiconductor devices, and more particularly, to a semiconductor device having an impurity region formed by ion implantation with a gate electrode as a mask, and a method of manufacturing thereof.

2. Description of the Background Art

A semiconductor device having a gate electrode is well known. FIG. 6 is a sectional view of a conventional P channel MOS transistor having a gate electrode. Referring to FIG. 6, a conventional P channel MOS transistor comprises an N type silicon substrate 11, an element isolation oxide film 12 formed on N type silicon substrate 11 with a predetermined distance therebetween for element isolation, one pair of $p^+$ impurity regions 16 formed between element isolation oxide films 12 with a predetermined distance therebetween, and a polycrystal silicon layer 14 formed between the pair of $p^+$ impurity regions 16 with a gate oxide film 13 thereunder. FIG. 7 is an enlarged sectional view for explaining the crystal structure of the gate electrode of FIG. 6. Referring to FIG. 7, polycrystal silicon layer 14 forming a gate electrode does not have the crystallographic axis of the crystal grains arranged in the same direction. More specifically, polycrystal silicon layer 14 is formed of crystal grains having two different plane orientations (111), (110), for example, as shown in FIG. 7.

FIGS. 8A-8D are sectional views for explaining the method of manufacturing a conventional P channel MOS transistor. Referring to FIG. 8A, an isolation oxide film 12 is formed on an N type silicon substrate 11 using the LOCOS method. Then, a gate oxide film 13 is formed all over the surface. Referring to FIG. 8B, a polycrystal silicon layer 14 having phosphorus doped is formed on gate oxide film 13 by the CVD method. Referring to 8C, gate oxide film 13 and polycrystal silicon layer 14 are selectively etched using a resist pattern (not shown) as a mask to form a gate wiring pattern. Referring to FIG. 8D, ion implantation of $B^+$ 17 is carried out using polycrystal silicon layer 14 which becomes a gate electrode as a mask. As a result, a $p^+$ impurity region 16 is formed in self-alignment. Thus, a conventional P channel MOS transistor is formed.

A conventional P channel MOS transistor has $p^+$ impurity region 16 formed in self-alignment using polycrystal silicon layer 14 which becomes a gate electrode as a mask, as mentioned above.

The crystallographic axis direction of the crystal grains of polycrystal silicon layer 14 comprises a plurality of different crystal orientations. Therefore, there was a problem that $B^+$ ions pass through polycrystal silicon layer 14 in the $B^+$ ion implantation process using polycrystal silicon layer 14 of FIG. 8D as a mask. This is called channelling phenomenon, occurring particularly when polycrystal silicon layer 14 forming the gate electrode has a columnar crystal structure whose plane orientation matches the ion implantation angle. Two types of channelling phenomenon are seen; one is where $B^+$ ions pass through the interior of the crystal grains, and another is where $B^+$ ions pass through the crystal grain boundary.

In a conventional polycrystal silicon layer 14 which becomes a gate electrode, there are local locations where $B^-$ ions easily pass through. $B^-$ ions passing through polycrystal silicon 14 also easily pass through the underlying gate oxide film 13 since gate oxide film 13 is very thin. This means that $B^-$ ions are implanted into the $N^-$ region beneath gate oxide film 13. The $N^+$ region right beneath gate oxide film 13 is the channel region of the P channel MOS transistor. This local $P^+$ ion implantation into the channel region will yield the following disadvantages.

A channel is likely to be formed, whereby $V_{TH}$ rises (the channel cut off voltage rises). The breakdown voltage between the source/drain decreases to induce a problem that the leakage current is increased at the time of channel off. There is also a problem of increase in leakage current and malfunction generation in the entire semiconductor device such as ICs and LSIs. These problems become more significant when elements are reduced in size to comply with increase in integration density of semiconductor devices. This means that reduction in film thickness of polycrystal silicon layer 14 which becomes the gate electrode and reduction in wiring width are required in accordance with miniaturization of elements. This is responsible for the crystal grains of polycrystal silicon layer 14 to become single layered, whereby the number of crystal grains is drastically reduced in the direction of the gate width. It is for this reason that $B^-$ ions easily pass through polycrystal silicon layer 14.

In a conventional P channel MOS transistor where an impurity region is formed by ion implantation using the gate electrode as a mask, it was difficult to effectively prevent ions from passing through locally to the channel region right beneath the gate electrode (channelling phenomenon). This resulted in the problem that the transistor characteristic of the eventually formed MOS transistor is aggravated.

SUMMARY OF THE INVENTION

An object of the present invention is to prevent aggravation of transistor characteristic in a semiconductor device having an impurity region formed by ion implantation using a gate electrode as a mask.

Another object of the present invention is to prevent leakage current of a transistor from increasing at the time of channel off even in a semiconductor device having an impurity region formed by ion implantation using a gate electrode as a mask.

A further object of the present invention is to effectively prevent channelling phenomenon in which ions pass through to a channel region right beneath a gate electrode in forming an impurity region by ion implantation using a gate electrode as a mask in a method of manufacturing a semiconductor device.

A still further object of the present invention is to prevent ions from passing through the crystal grain boundary of crystals forming a gate electrode, in forming an impurity region by ion implantation using a gate electrode as a mask in a method of manufacturing a semiconductor device.

Yet another object of the present invention is to easily prevent ions from passing through to beneath a gate electrode without complicating the manufacturing process, in forming an impurity region by ion implantation using a gate electrode as a mask in a method of manufacturing a semiconductor device.

According to an aspect of the present invention, a semiconductor device includes a semiconductor substrate of a first conductivity type, a pair of impurity regions of a second conductivity type, and a gate electrode. The pair of impurity regions are formed on the semiconductor substrate of the first conductivity type with a predetermined distance therebetween. The gate electrode is formed on the semiconductor substrate between the pair of impurity regions with an insulating film thereunder. The gate electrode includes a polycrystal silicon layer having the crystal orientation of the crystal grains arranged in a predetermined orientation, and a single crystal layer having a crystal orientation identical to that of the polycrystal layer. The polycrystal layer is formed on the insulating film on the semiconductor substrate. The single crystal layer is formed on the polycrystal layer.

In operation, the gate electrode is implemented of a multilayer of a polycrystal layer and a single crystal layer, so that channelling due to the single crystal layer is effectively prevented.

According to another aspect of the present invention, a semiconductor device includes a semiconductor substrate of a first conductivity type, one pair of impurity regions of a second conductivity type, and a gate electrode. The pair of impurity regions is formed on the semiconductor substrate of the first conductivity type with a predetermined distance therebetween. The gate electrode is formed on the semiconductor substrate between the pair of impurity regions with an insulating film thereunder. The gate electrode includes a multilayer structure of a polycrystal layer and a single crystal layer.

In operation, the gate electrode includes a polycrystal layer formed on the insulating film on the semiconductor substrate, having the crystal orientation of the crystal grains arranged in a predetermined orientation, and a single crystal layer formed on the polycrystal layer, having a crystal orientation identical to that of the polycrystal layer. By implanting ions in a predetermined angle with respect to the crystal orientation of the polycrystal layer, ions are effectively prevented from locally passing through the gate electrode to be implanted right beneath the gate electrode. Furthermore, since there is no grain boundary in the single crystal layer, ions can be effectively prevented from passing through the grain boundary which occurs in the case where the gate electrode is formed of only a polycrystal layer.

According to a further aspect of the present invention, a method of manufacturing a semiconductor device comprises the step of forming a polycrystal layer on a semiconductor substrate so that the crystal orientation of the crystal grains are arranged in a predetermined orientation. A single crystal layer is formed on the crystal layer so that the crystal orientation of the crystal grain thereof is identical to that of the polycrystal layer. A multilayer of a predetermined configuration is formed by patterning the polycrystal layer and the single crystal layer. Using the multilayer as a mask, and by implanting ions from a predetermined angle with respect to the crystal orientation of the single crystal layer, an impurity region is formed on the semiconductor substrate.

In operation, a polycrystal layer is formed on a semiconductor substrate so that the crystal orientation of the crystal grain thereof is arranged in a predetermined orientation, and a single crystal layer is formed on the polycrystal layer so that the crystal orientation of the crystal grains is identical to that of the polycrystal layer. A multilayer is formed of a predetermined configuration by patterning the polycrystal layer and the single crystal layer. An impurity region is formed on the semiconductor substrate by implanting ions from a predetermined angle with respect to the crystal orientation of the single crystal layer using the multilayer as a mask. As a result, ions are effectively prevented from locally passing through the gate electrode to right beneath the gate at the time of ion implantation. By implanting ions at a predetermined angle with respect to the crystal orientation of the crystal grain, ions can be easily prevented from passing through right beneath the gate electrode.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 4A-4D are graphs indicating the X-ray diffraction of the crystal orientation of a polycrystal silicon layer varying in temperature, at the step of forming a polycrystalline silicon layer by low pressure CVD method.

DESCRIPTION OF THE PREFERRED EMBODIMENTS

An embodiment of the present invention will be explained hereinafter with reference to the drawings.

Figure 1:
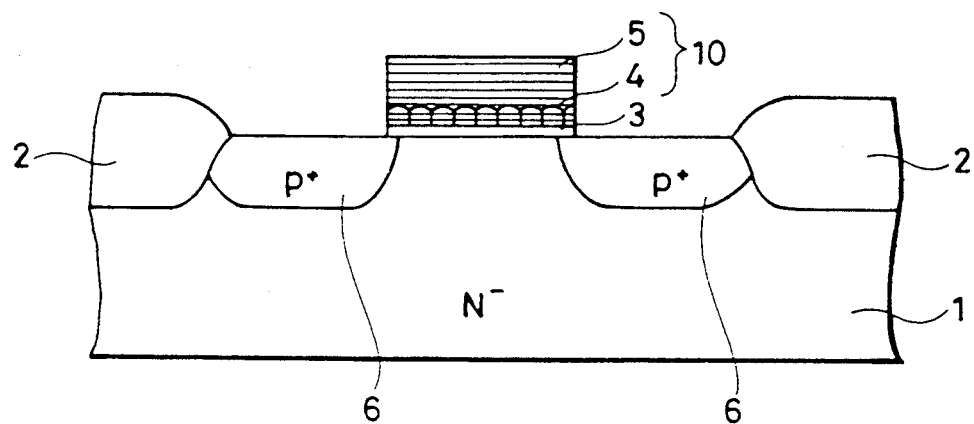
FIG. 1 is a sectional view of a P channel MOS transistor having a gate electrode according to an embodiment of the present invention.

Referring to FIG. 1, a P channel MOS transistor of the present embodiment comprises an N type silicon substrate 1, an element isolation oxide films 2 formed on N type silicon substrate 1 with a predetermined distance therebetween for element isolation, a $p^+$ impurity region 6 formed between element isolation oxide films 2 with a predetermined distance therebetween, a polycrystal silicon layer 4 formed between $p^+$ impurity regions 6 with a gate oxide film 3 thereunder, and a single crystal silicon layer 5 formed on polycrystal silicon layer 4. Polycrystal silicon layer 4 and single crystal silicon layer 5 form a gate electrode 10 of the p channel MOS transistor. In other words, gate electrode 10 has a two layered structure of polycrystal silicon layer 4 and single crystal silicon layer 5.

Figure 2:
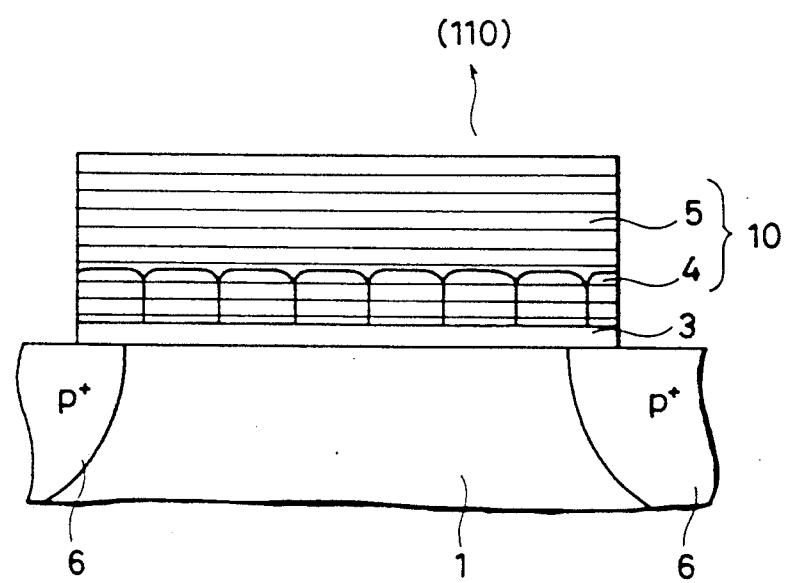
FIG. 2 is an enlargement sectional view for explaining the crystal structure of the gate electrode of FIG. 1.

It can be seen from FIG. 2 that the crystal orientations of polycrystal silicon layer 4 and single crystal silicon layer 5 are arranged in one orientation. In other words, polycrystal silicon layer 4 differs from a conventional layer in that the plane orientation of the crystal grains is arranged at (110). Single crystal silicon layer 5 formed on polycrystal silicon layer 4 is formed so that the plane orientation of the crystal grain thereof is identical to the plane orientation of (110) of polycrystal silicon layer 4.

In the present embodiment, channelling phenomenon right beneath gate electrode 10 is effectively prevented at the time of forming a p⁻ impurity region 6 explained afterwards, by arranging the crystal orientation of polycrystal silicon layer 4 and single crystal silicon layer 5 forming gate electrode 10 in one plane orientation (110). As a result, the transistor characteristic is not aggravated in the eventually formed P channel MOS transistor. By forming a single crystal silicon layer 5 on polycrystal silicon layer 4 with the plane orientation of the crystal grains arranged to (110), ions passing through the crystal boundary (channeling phenomenon) is effectively prevented which was encountered in a device having a gate electrode conventionally formed by only a polycrystal silicon layer.

Figure 3A:
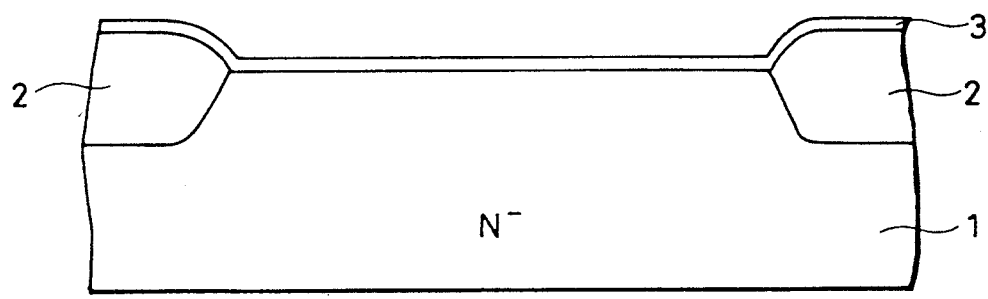
FIGS. 3A-3E are sectional views of the P channel MOS transistor of FIG. 1 for explaining the method of manufacturing thereof.
Figure 3B:
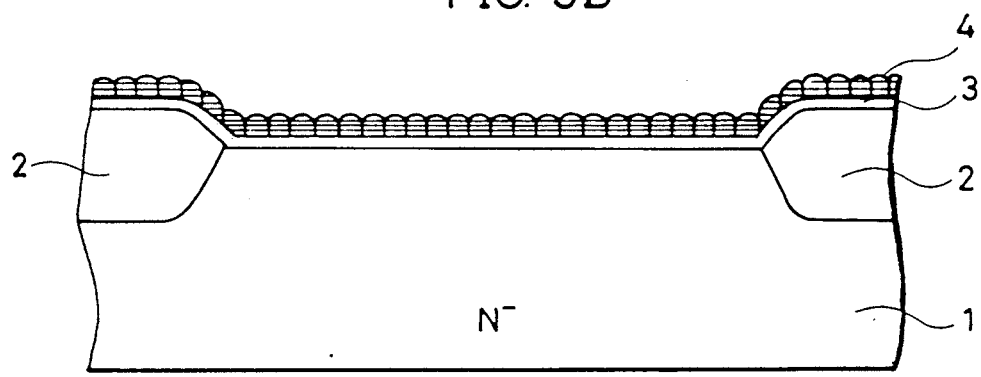
Figure 3C:
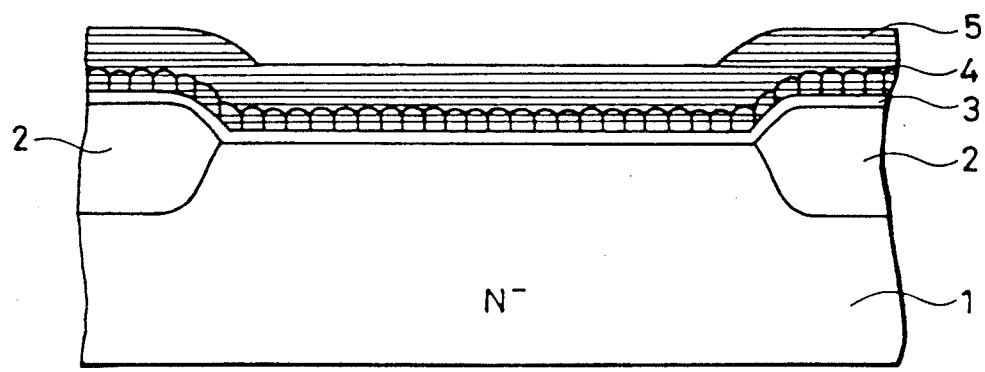
Figure 3D:
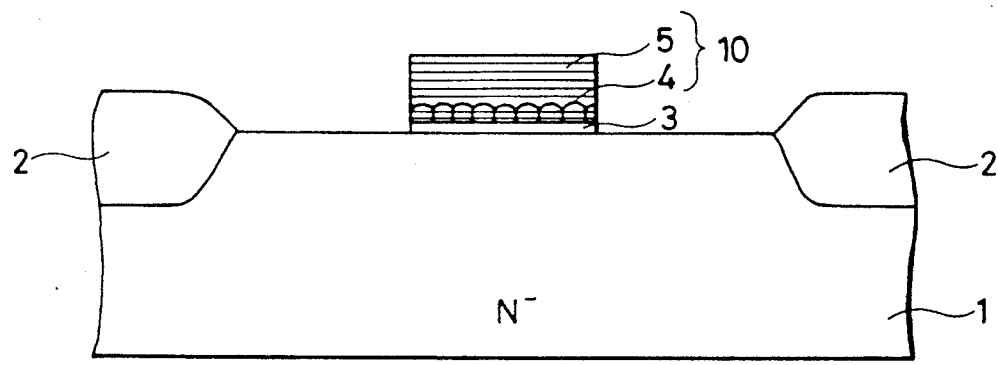
Figure 3E:
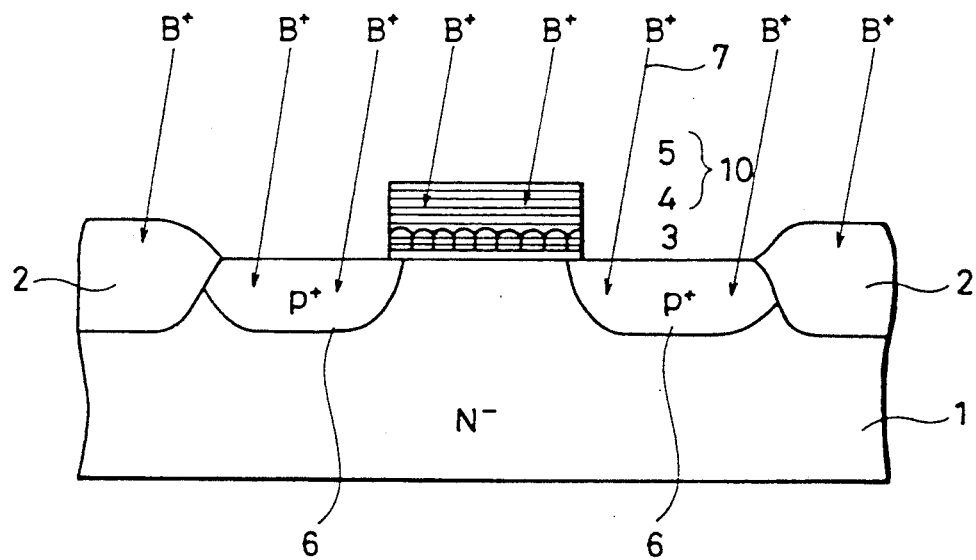

The manufacturing process will be explained hereinafter with reference to FIGS. 3A-3E. Referring to FIG. 3A, element isolation oxide film 2 is formed on N type silicon substrate 1 by the LOCOS method, for isolating adjacent elements. Gate oxide film 3 is formed over element isolation oxide film 2 and N type silicon substrate 1. Referring to FIG. 3B, polycrystal silicon layer 4 is formed on gate oxide film 3 by doping phosphorus using the low pressure CVD method. The preferable formation conditions are atmospheric pressure of 0.1-1.0 Torr, 100% silane or 20-30% silane in nitrogen as reaction gas, and atmospheric temperature of 550° C.-620° C. More preferably, the atmospheric pressure is 0.17 Torr, the usage of 100% silane as reaction gas, and the atmospheric temperature is 620° C. The temperature condition will be explained afterwards in more detail. After the formation of polycrystal silicon layer 4, single crystal silicon layer 5 doped with phosphorus is grown in an epitaxial manner on polycrystal silicon layer 4. It is desirable that the temperature is 620° C. or below. Using a resist pattern (not shown) as a mask, a gate wiring pattern constituted by gate oxide film 3, polycrystal silicon layer 4 and single crystal silicon layer 5 is formed by selective etching as shown in FIG. 3D. Thus, a gate electrode is formed constituted by polycrystal silicon layer 4 and single crystal silicon layer 5 having the same crystal orientation. Referring to FIG. 3E, B⁺ ions 7 are implanted using gate electrode 20 constituted by polycrystal silicon layer 4 and single crystal silicon layer as a mask. This results in the formation of p⁺ impurity region 6 in self-alignment. The present embodiment differs from a conventional embodiment in that the crystal orientation of polycrystal silicon layer 4 forming the gate electrode is in a definite direction. Single crystal silicon layer 5 having a plane orientation identical to that of polycrystal silicon layer 4 is grown in an epitaxial manner. By forming a gate electrode including single crystal silicon layer 5 in the above described manner, the angle that can prevent channelling phenomenon at the time of B⁺ ion implantation is identical for all the regions in the gate electrode. Therefore, B⁺ ions can be easily prevented from passing to right beneath through gate electrode 10 by adjusting the implantation angle of B⁺ ions. Furthermore, because there is no grain boundary in single crystal silicon layer 5, ions passing through the grain boundary encountered when a gate electrode is formed only with a polycrystal silicon layer can be prevented.

The formation of single crystal silicon layer 5 on polycrystal silicon layer 4 requires that the crystal orientation of the crystal grains of polycrystal silicon layer 4 are arranged in a definite direction. Therefore polycrystal silicon layer 4 must be formed under the temperature of 550° C.-620° C., as described above.

Figure 4D:
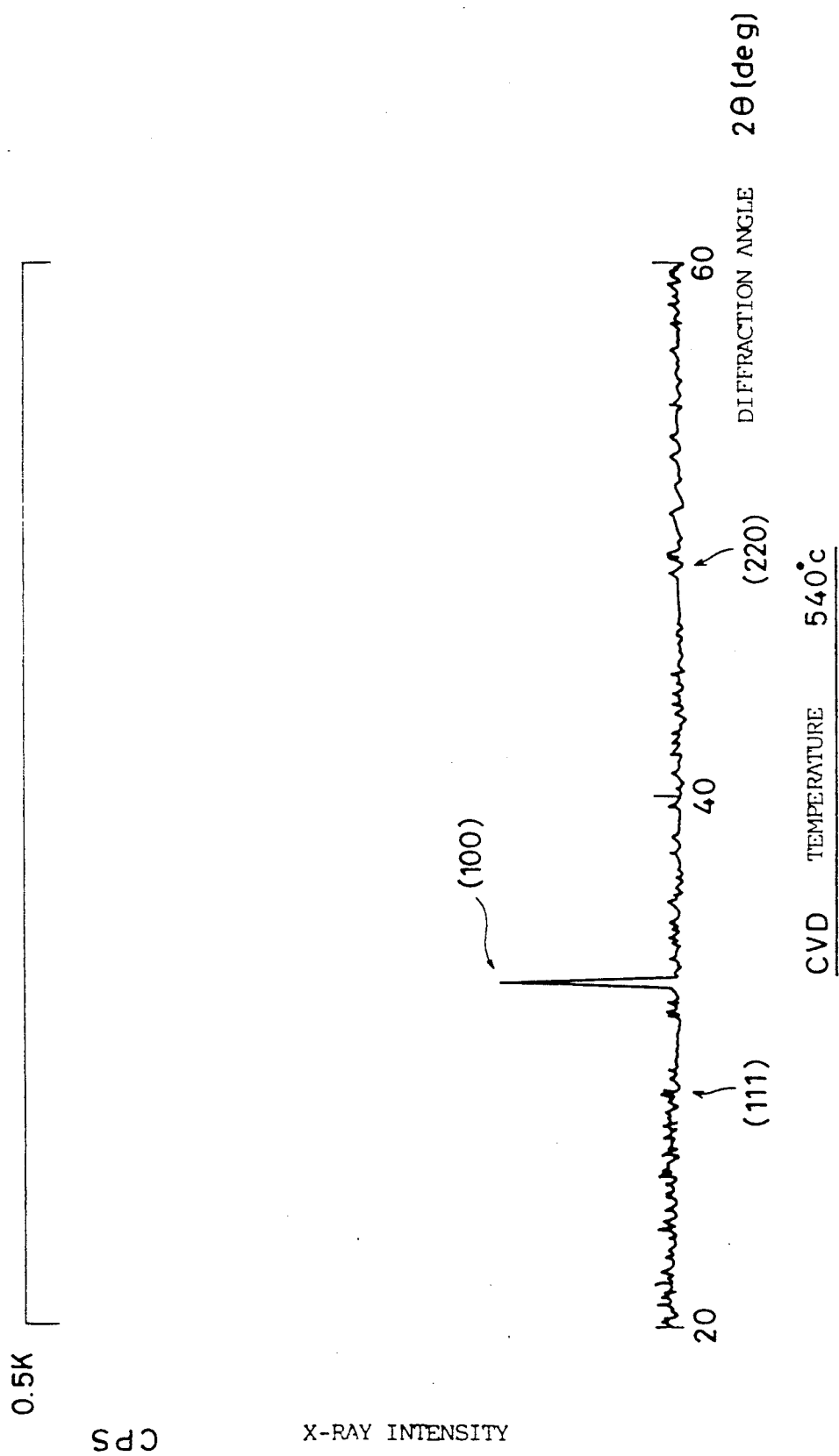

The temperature condition for arranging the crystal orientation of polycrystal silicon layer 4 in a definite direction will be explained hereinafter with reference to FIGS. 4A-4D. FIG. 4A is a graph indicating the crystal orientation when polycrystal silicon layer 4 is formed at a CVD temperature (atmospheric temperature) of 660° C. It can be appreciated from the graph that the peak of plane orientation (100) represents the crystal orientation of N type silicon substrate 1. The peaks of plane orientation (111) and (110) indicate the crystal orientation of polycrystal silicon layer 4. In other words, polycrystal silicon layer 4 has two different plane orientations (110) and (111) when formed at a CVD temperature of 660° C. This means that it is difficult to arrange the crystal orientation of polycrystal silicon layer 4 in a definite direction at the CVD temperature of 660° C. FIG. 4B shows the case where polycrystal silicon layer 4 is formed at a CVD temperature (atmospheric temperature) of 640° C. It can be appreciated from the graph that plane orientation (111) of polycrystal silicon layer 4, although lowered, is still present. It is therefore difficult to arrange the crystal orientation of polycrystal silicon layer 4 in a definite direction even at the CVD temperature of 640° C. FIG. 4C shows a case where polycrystal silicon layer 4 is formed at a CVD temperature of 620° C. Regarding the plane orientations of (111) and (110) of polycrystal silicon layer 4, the peak of plane orientation (111) is substantially eliminated. This means that polycrystal silicon layer 4 only has the peak of plane orientation (110) when formed at the CVD temperature of 620° C. By lowering the temperature of the CVD condition, only the peak of plane orientation (110) remains when the temperature condition is 620° C. It can be understood that the crystal orientation of the crystal grains of polycrystal silicon layer 4 are arranged in the direction of plane orientation (110). FIG. 4D shows a case where the CVD temperature is further lowered to 540° C. It can be seen from the graph that only the plane orientation (100) of the crystal grain of N type silicon substrate 1 remains. This means that polycrystal silicon layer 4 is amorphous. A temperature above approximately 550° C. is desirable for arranging the crystal orientation of polycrystal silicon layer 4 in a definite direction. Thus, it is necessary to form polycrystal silicon layer 4 at a CVD temperature (atmospheric temperature) of 550° C. to 620° C. for arranging the crystal orientation in a definite direction. Other conditions besides the temperature condition are atmospheric pressure 0.1-1.0 Torr, and usage of 100% silane or 20-30% silane in nitrogen as reaction gas, as mentioned before. After forming polycrystal silicon layer 4 having the crystal orientation arranged in a definite direction under the above described conditions, a single crystal silicon layer having an identical crystal orientation can be formed by epitaxial growth with polycrystal silicon layer 4 as the core.

Figure 5:
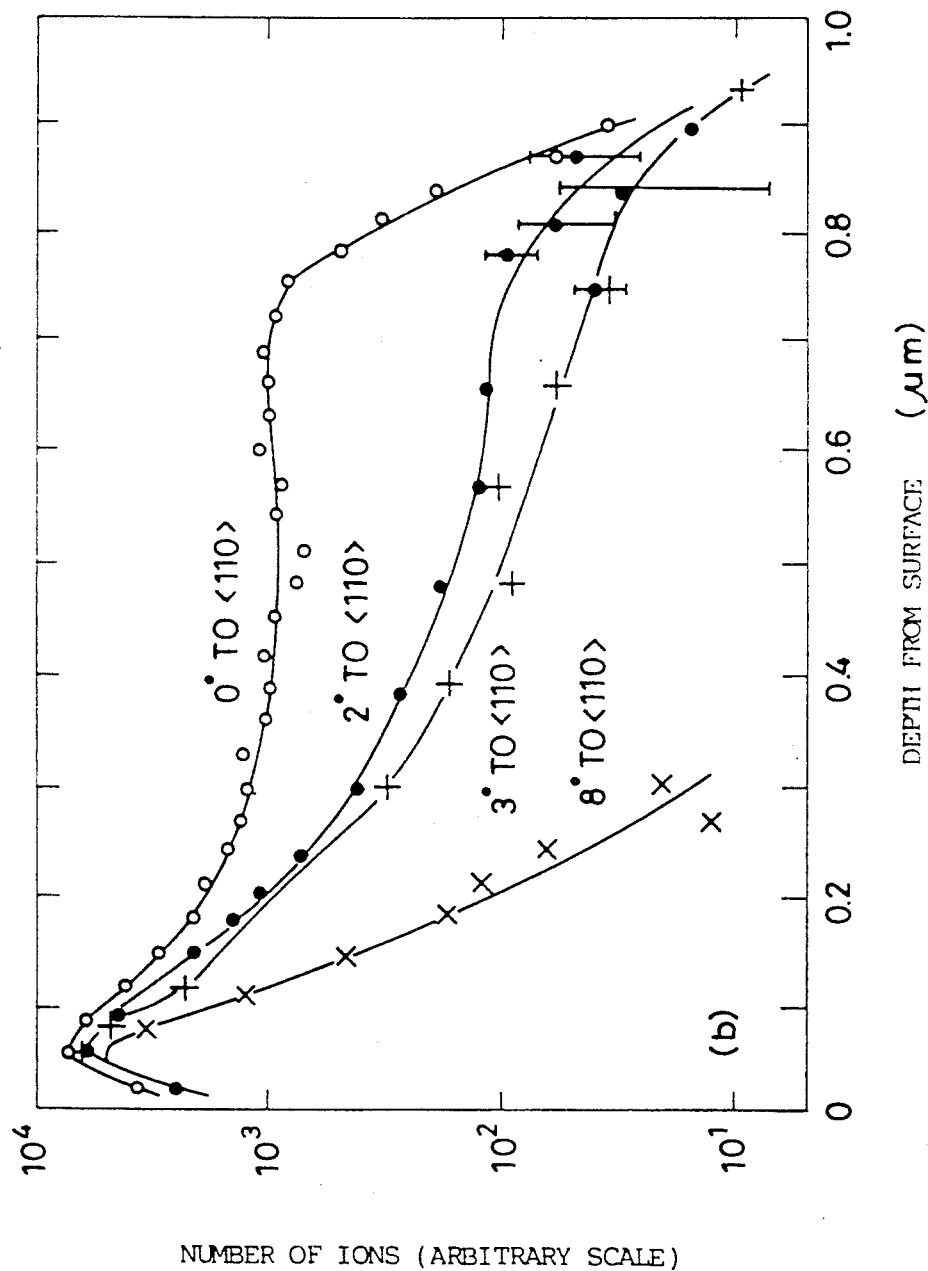
FIG. 5 is a graph showing the relation between the ion implantation angle and the ion implantation depth with respect to the crystallographic axis orientation of (110).
Figure 6:
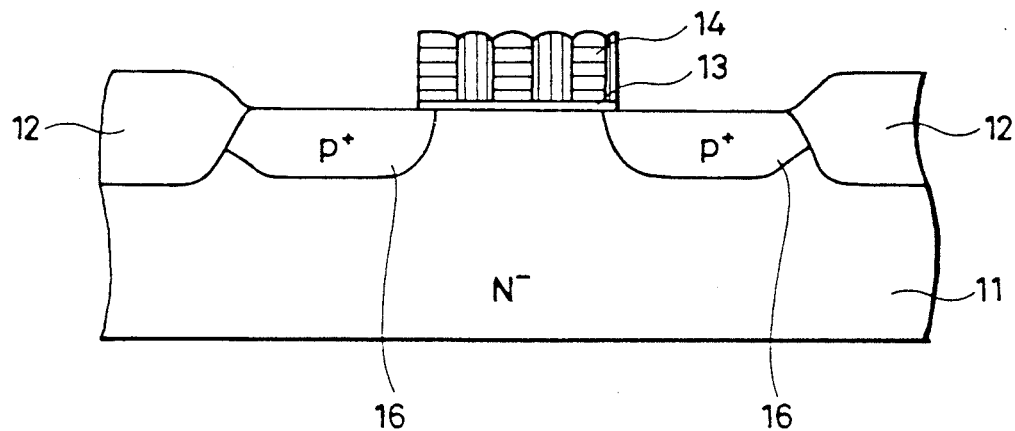
FIG. 6 is a sectional view of a conventional P channel MOS transistor having a gate electrode.
Figure 7:
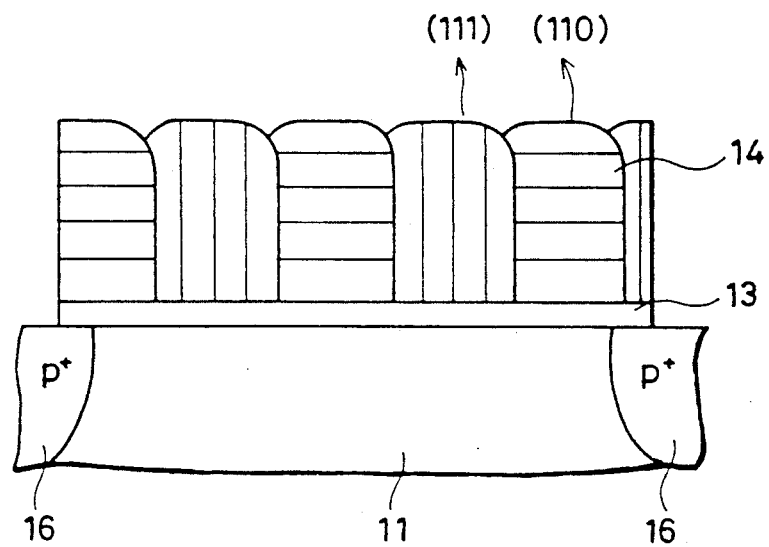
FIG. 7 is an enlargement sectional view for explaining the crystal structure of the gate electrode of FIG. 6.
Figure 8A:
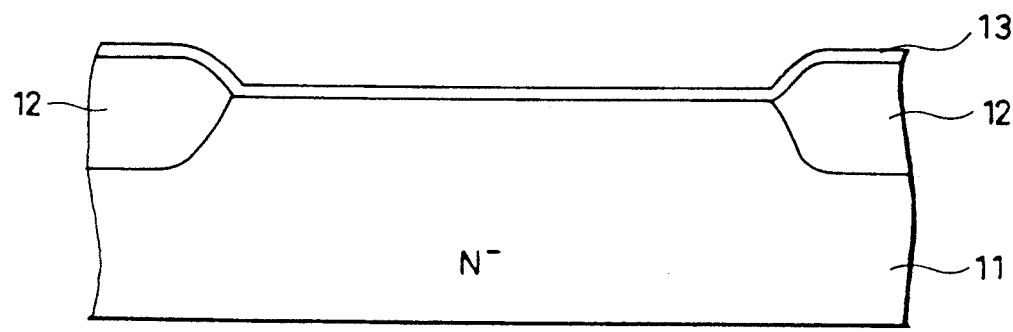
FIGS. 8A-8D are sectional views of a conventional P channel MOS transistor for explaining the method of manufacturing thereof.
Figure 8B:
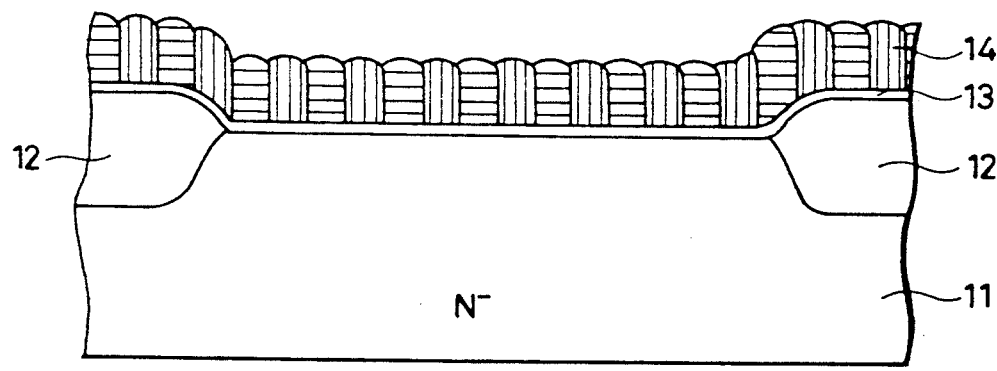
Figure 8C:
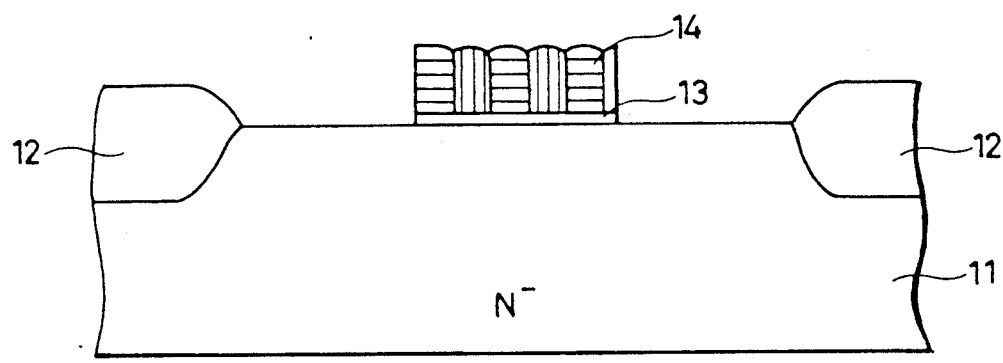
Figure 8D:
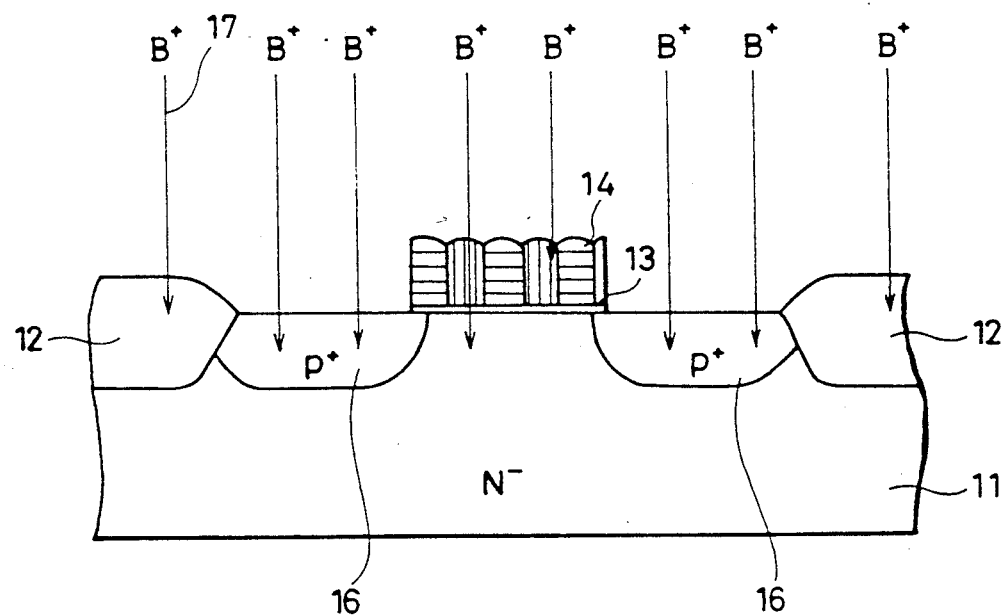

According to the above described conditions, polycrystal silicon layer 4 and single crystal silicon layer 5 having an identical plane orientation of (110) is formed. It is desirable that the angle of ion implantation is approximately 8° using gate electrode 10 of plane orientation (110) as a mask. The graph of FIG. 5 is shown in chapter 5, 5.3, FIG. 5.8. *MOS LSI Manufacturing Technology*. Nikkei Mcgraw-Hill. It can be appreciated from FIG. 5 that the ion implantation depth takes a smallest value when implanted at an angle of 8° with respect to the axis orientation when the crystal orientation is at a plane orientation of (110). This means that channelling phenomenon is least likely to occur when ions are implanted from an angle of 8° with respect to the axis orientation of the crystallographic axis.

As described above, gate electrode 10 is formed of polycrystal silicon layer 4 having the crystal orientation arranged in a definite direction and single crystal silicon layer 5 having a crystal orientation identical to that of polycrystal silicon layer 4, in the present embodiment. This structure prevents ions from passing through right beneath gate electrode 10 (channelling phenomenon) in ion implantation using gate electrode 10 as a mask. Because there is no grain boundary in single crystal silicon layer 5, ions passing through the grain boundary can be prevented completely. As a result, the transistor characteristic of the completed transistor is not aggravated. It is also possible to prevent increase in leakage current and reduce malfunction generation which was the problem in the entire semiconductor device.

The present invention is not limited to the present embodiment in which an application to a P channel MOS transistor is employed, and can be applied to an N channel MOS transistor. Although the present embodiment was described in which the crystal orientation of the crystal grains of polycrystal silicon layer 4 was arranged to the plane orientation of (110), the present invention is not limited to (110), and the crystal orientation may be arranged to the plane orientation of (111). The temperature condition should be adjusted in the low pressure CVD method for arranging the crystal orientation to the plane orientation of (111). The present invention is not limited to the present embodiment in which the implantation angle was 8° with respect to the crystallographic axis orientation of single crystal silicon layer 5. Any angle that can prevent channelling phenomenon is available with respect to the crystal orientation of the formed single crystal silicon layer.

A semiconductor device according to a concept of the present invention has the gate electrode implemented with a multilayer structure of a polycrystal layer and a single crystal layer to effectively prevent channelling phenomenon by the single crystal layer. Therefore the transistor characteristic is not aggravated in forming an impurity region by ion implantation using the gate electrode as a mask.

A semiconductor device according to another concept of the present invention includes a gate electrode formed of a polycrystal layer having the crystal orientation of the crystal grains arranged in a predetermined orientation, on an insulating film on a semiconductor substrate, and a single crystal layer on the polycrystal layer having a crystal orientation identical to that of the polycrystal layer. By implanting ions at a predetermined angle with respect to the crystal orientation of the single crystal layer, ions can be effectively prevented from locally passing through the gate electrode and being implanted right below. Furthermore, since there is no grain boundary in the single crystal layer, ions can be effectively prevented from passing through the grain boundary which occurs in the case where the gate electrode is formed of only a polycrystal layer. Thus, a semiconductor device is provided not aggravated in transistor characteristic by effectively preventing channelling phenomenon in forming an impurity region by ion implantation using a gate electrode as a mask.

According to a further aspect of the present invention, a method of manufacturing a semiconductor device comprises the step of forming a polycrystal layer on a semiconductor substrate so that the crystal orientation of the crystal grains are arranged in a predetermined orientation. A single crystal layer is formed on the crystal layer so that the crystal orientation of the crystal grain thereof is identical to that of the polycrystal layer. A multilayer of a predetermined configuration is formed by patterning the polycrystal layer and the single crystal layer. Using the multilayer as a mask, and by implanting ions from a predetermined angle with respect to the crystal orientation of the single crystal layer, an impurity region is formed on the semiconductor substrate. Thus, a method of manufacturing a semiconductor device not degraded in transistor characteristic is provided, in forming an impurity region by ion implantation using a gate electrode as a mask, whereby the channelling phenomenon is effectively prevented. The manufacturing process is not complicated since ions can be easily prevented from passing through to beneath the gate electrode by implanting ions at a predetermined angle to the crystal orientation of the crystal grain.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a semiconductor substrate of a first conductivity type,
   a pair of impurity regions of a second conductivity type, formed on said semiconductor substrate of said first conductivity type with a predetermined distance therebetween, and
   a gate electrode formed between said pair of impurity regions above said semiconductor substrate with an insulating film thereunder,
   said gate electrode comprising a multilayer structure of a polycrystal layer and a single crystal layer.

2. The semiconductor device according to claim 1, wherein
   said polycrystal layer comprises a polycrystal silicon layer, and
   said single crystal layer comprises a single crystal silicon layer.

3. The semiconductor device according to claim 2, wherein said polycrystal silicon layer comprises a CVD polycrystal silicon layer.

4. The semiconductor device according to claim 2, wherein said single crystal silicon layer comprises an epitaxial single crystal silicon layer.

5. A semiconductor device comprising:
   a semiconductor substrate of a first conductivity type,
   a pair of impurity regions of a second conductivity type, formed on said semiconductor substrate of said first conductivity type with a predetermined distance therebetween, and
   a gate electrode formed between said pair of impurity regions above said semiconductor substrate with an insulating film thereunder,
   wherein said gate electrode comprises a polycrystal layer formed on said insulating film on said semiconductor substrate, and having the crystal orientation of the crystal grain thereof arranged in a predetermined orientation, a single crystal layer formed on said polycrystal layer, and having a crystal orientation identical to that of said polycrystal layer.

6. The semiconductor device according to claim 5, wherein said polycrystal layer comprises a polycrystal silicon layer and said single crystal layer comprises a single crystal silicon layer.

7. The semiconductor device according to claim 6, wherein the crystal orientation of said polycrystal silicon layer and said single crystal silicon layer is a plane orientation of 110.

8. The semiconductor device according to claim 6, wherein the crystal orientation of said polycrystal silicon layer and said single crystal silicon layer is a plane orientation of 111.

9. The semiconductor device according to claim 6, wherein said polycrystal silicon layer comprises a CVD polycrystal silicon layer.

10. The semiconductor device according to claim 6, wherein said single crystal silicon layer comprises an epitaxial single crystal silicon layer.

11. The semiconductor device according to claim 5, wherein said gate electrode and said pair of impurity regions implement a MOS transistor.

* * * * *